(12) United States Patent
Ejiri

(10) Patent No.: US 6,610,603 B2
(45) Date of Patent: Aug. 26, 2003

(54) METHOD OF MANUFACTURING A CAPACITOR

(75) Inventor: Hirokazu Ejiri, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/877,424

(22) Filed: Jun. 8, 2001

(65) Prior Publication Data

US 2002/0025679 A1 Feb. 28, 2002

(30) Foreign Application Priority Data

Jun. 8, 2000 (JP) ..................... P2000-172381

(51) Int. Cl.[7] ............................................. H01L 21/311
(52) U.S. Cl. ........................................ 438/694; 438/697
(58) Field of Search ................. 438/238–239, 438/240, 241, 243, 267, 386, 399, 694, 697

(56) References Cited

U.S. PATENT DOCUMENTS

| | | | |
|---|---|---|---|
| 5,234,854 A | * 8/1993 | An et al. ................ | 438/387 |
| 5,461,010 A | * 10/1995 | Chen et al. ............. | 438/699 |
| 5,817,555 A | * 10/1998 | Cho ........................ | 438/253 |
| 5,904,521 A | * 5/1999 | Jeng et al. .............. | 438/253 |
| 5,956,587 A | * 9/1999 | Chen et al. ............. | 438/255 |
| 6,274,435 B1 | * 8/2001 | Chen ....................... | 438/267 |

\* cited by examiner

*Primary Examiner*—Kin-Chan Chen
(74) *Attorney, Agent, or Firm*—Robert J. Depke; Holland & Knight LLC

(57) ABSTRACT

In order to prevent a capacitance element from suffering fluctuation in the capacitance value and deterioration of the reliability caused in the step for planarizing the surface of the substrate after forming the capacitance element, there is provided a process for fabricating a semiconductor device, in which an insulator is formed on a semiconductor substrate; a first wiring layer to be a lower portion electrode; a $Ta_2O_5$ layer to be a dielectric film; a second wiring layer to be an upper portion electrode are successively formed; a pattern for the dielectric film and upper portion electrode is formed; a pattern for the lower portion electrode is subsequently formed; an SiN film is formed as a protective film; and planarization is conducted by etching back a spin on glass (SOG).

2 Claims, 5 Drawing Sheets

A:PORTION EXPOSED BY PLANARIZATION
B:PORTION ETCHED BY PLANARIZATION

METHOD OF MANUFACTURING A CAPACITOR

RELATED APPLICATION DATA

The present application claims priority to Japanese Application No. P2000-172381 filed Jun. 8, 2000, which application is incorporated herein by reference to the extent permitted by law.

BACKGROUND OF THE INVENTION

1. Field of the Invention

The present invention relates to a process for fabricating a semiconductor device for forming a capacitance element on a semiconductor substrate.

2. Description of Related Art

Conventionally, as a semiconductor device having a capacitance element, one having a structure such that first and second wiring layers formed on a semiconductor substrate serve as a lower portion electrode and an upper portion electrode, respectively, and a dielectric film formed as an intermediate layer between the wiring layers serves as a capacitance element has been known.

FIG. 5 is a diagrammatic cross-sectional view illustrating the layer structure of such a conventional semiconductor device.

In this semiconductor device, a lower portion electrode 12 comprised of TiN/Al—Si/Ti/TiON/Ti layers is formed on a semiconductor substrate 10, a dielectric film 14 comprised of a $Ta_2O_5$ layer is formed thereon, and an upper portion electrode 16 comprised of a TiN layer is further formed thereon.

On an upper surface of the upper portion electrode 16, insulator films 18, 20 comprised of an SiN layer and an $SiO_2$ layer, respectively, and metal electrode wirings 24, 26 are formed in via holes 22 formed in the insulator films 18, 20, respectively.

In the above-mentioned process for fabricating a semiconductor device, after forming a capacitance element, an insulator film 28 comprised of a spin on glass (hereinafter, frequently referred to simply as "SOG") is formed and the entire surface of the insulator film 28 is etched to planarize the insulator film.

However, when the insulator film 28 is planarized as mentioned above, a problem occurs in that the capacitance value of the capacitance element is fluctuated or the reliability of the capacitance element is deteriorated.

The reason that such a problem occurs resides in that the portion in which the capacitance element is formed (for example, the portions indicated by characters A and B in FIG. 5) has a large protrusion step, as compared to another field region, and therefore, the insulator film in the capacitance element portion is removed in the planarization step, so that the capacitance element suffers a damage or also the upper portion electrode and the dielectric film are etched.

It is an object of the present invention to provide a process for fabricating a semiconductor device, which can prevent the capacitance element from suffering fluctuation in the capacitance value and deterioration of the reliability caused in the planarization step.

SUMMARY OF THE INVENTION

For attaining the above object, the present invention provides a process for fabricating a semiconductor device, comprising the steps of: forming, on an insulator formed on a semiconductor substrate, a first wiring layer to be a lower portion electrode for a capacitance element; forming, on the first wiring layer, a dielectric film for forming the capacitance element; forming, on the dielectric film, a second wiring layer to be an upper portion electrode for the capacitance element; and removing the dielectric film and the second wiring layer other than a region in which a capacitance is to be formed while removing an unnecessary region of the first wiring layer, wherein after the removing step, the process has a planarization step in which an insulator film is deposited on a surface of the semiconductor substrate and the entire surface of the insulator film is etched or polished to planarize the surface of the substrate, wherein a protective insulator film which is not removed in the planarization step is formed on at least an upper surface of the capacitance element so that the capacitance element is not exposed in the planarization step.

In the process for fabricating a semiconductor device of the present invention, in the first wiring layer formation step, a first wiring layer to be a lower portion electrode for a capacitance element is formed on an insulator formed on a semiconductor substrate.

Then, in the dielectric film formation step, a dielectric film for forming the capacitance element is formed on the first wiring layer, and in the second wiring layer formation step, a second wiring layer to be an upper portion electrode for the capacitance element is formed on the dielectric film.

Then, in the removing step, the dielectric film and the second wiring layer other than a region in which a capacitance is to be formed are removed while removing an unnecessary region of the first wiring layer. Further, in the planarization step, an insulator film is deposited on a surface of the semiconductor substrate and the entire surface of the insulator film is etched to planarize the surface of the substrate.

Prior to the planarization step, a protective insulator film which is not removed in the planarization step is formed on at least an upper surface of the capacitance element so that the capacitance element is not exposed in the planarization step.

By the process having the above characteristic feature, the dielectric film and electrodes constituting the capacitance element are protected from the etching in the planarization step, thus making it possible to prevent the capacitance element from suffering fluctuation in the capacitance value and deterioration of the reliability.

As mentioned above, in the process for fabricating a semiconductor device of the present invention, in the formation of a capacitance element on a semiconductor substrate, prior to the planarization step in which the surface of the substrate is planarized after forming the capacitance element, a protective insulator film which is not removed in the planarization step is formed on at least an upper surface of the capacitance element so that the capacitance element is not exposed in the planarization step. Therefore, the upper portion electrode and the dielectric film constituting the capacitance element are not etched and suffer no damage in the planarization processing, so that a capacitance element free from fluctuation in the properties and having high reliability can be obtained.

BRIEF DESCRIPTION OF THE DRAWINGS

The foregoing and other objects, features and advantages of the present invention will be apparent to those skilled in the art from the following description of the presently preferred exemplary embodiments of the invention taken in connection with the accompanying drawings, in which.

DETAILED DESCRIPTION OF THE PREFERRED EMBODIMENTS

Hereinbelow, preferred embodiments of the fabrication process for a semiconductor device of the present invention will be described in detail.

FIGS. 1A to 1F are diagrammatic cross-sectional views showing the fabrication process for a semiconductor device according to the first embodiment of the present invention.

Figure 1A:
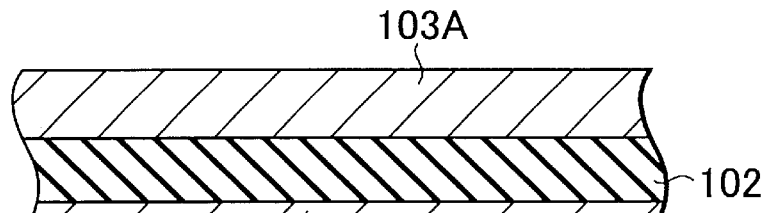
FIGS. 1A to 1F are diagrammatic cross-sectional views illustrating the layer structures in the respective steps of the fabrication process for a semiconductor device according to a first embodiment of the present invention.

First, in FIG. 1A, an insulator 102 is formed on a semiconductor substrate 101 so as to have a thickness of about 200 to 1,500 nm, and, as a first wiring layer 103A for forming a lower portion electrode 103, for example, TiN/ Al—Si/Ti/TiON/Ti layers are deposited in this order from the upper layer by a sputtering process.

In this case, the TiN layer serves as an anti-reflection film in the photolithography process and as an anti-oxidizing film for the Al—Si layer, and the thickness of the TiN layer is set at about 5 to 70 nm. In addition, the thickness of the Al—Si layer is set at about 300 to 1,500 nm.

The thickness of the Ti/TiON/Ti layers as a barrier metal are respectively set at about 5 to 70 nm/about 10 to 200 nm/about 5 to 70 nm.

Next, in FIG. 1B, as a dielectric film 104, for example, a $Ta_2O_5$ layer is deposited by a chemical vapor deposition (hereinafter, frequently referred to simply as "CVD") process so as to have a thickness of about 10 to 300 nm, and then, as a second wiring layer for forming an upper portion electrode 105, a Ti or TiN layer is deposited by a sputtering process so as to have a thickness of about 5 to 100 nm. Then, the TiN layer and the dielectric $Ta_2O_5$ layer other than a region in which a capacitance is to be formed are removed by a photolithography process and a reactive ion etching (hereinafter, frequently referred to simply as "RIE") process to form a pattern for the dielectric film 104 and the upper portion electrode 105.

Subsequently, the lower portion electrode 103 is similarly processed into a predetermined pattern by a photolithography process and an RIE process, and an SiN layer 106 is deposited by, for example, a plasma CVD process so as to have a thickness of about 5 to 200 nm (see FIG. 1C). The SiN layer 106 functions as a protective insulator film for the capacitance element in the subsequent planarization step.

Figure 1B:
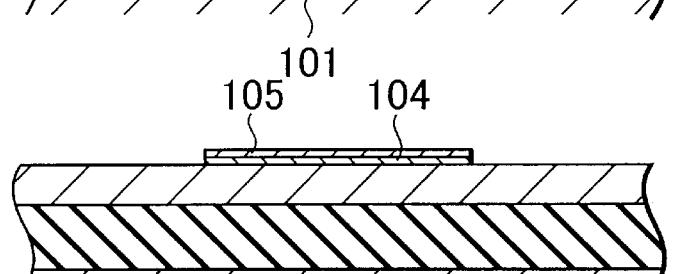
Figure 1C:
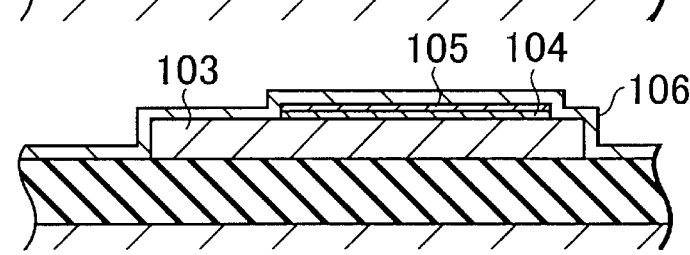
Figure 1D:
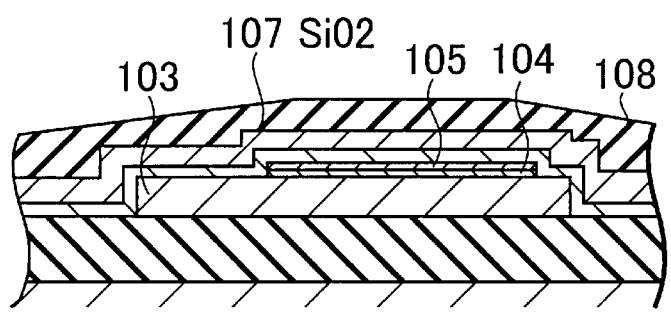

Then, as a wiring interlayer film, an $SiO_2$ layer 107 is deposited from tetraethylorthosilicate (TEOS) as a raw material by a plasma CVD process so as to have a thickness of 300 to 1,500 nm, and, for example, a SOG layer 108 is applied thereto (see FIG. 1D).

In this instance, the surface to which the SOG layer 108 is applied is planarized. Therefore, the thickness of the SOG layer 108 applied in the capacitance element portion, especially the periphery portion is small, as compared to that in the field region.

Figure 1E:
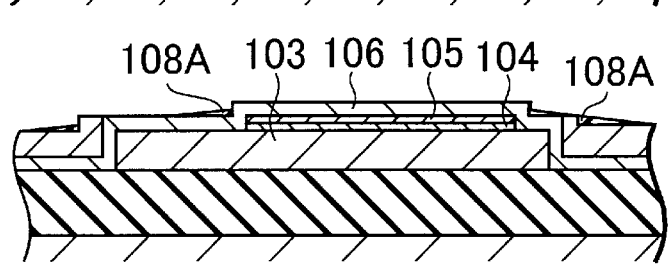

Then, etchback is conducted by an RIE process to effect planarization (see FIG. 1E). In this instance, an etching rate is selected so that a SOG 108A remains only in the step portion and does not remain on the field portion and the planarized portion. Such a selection of the etching rate is for preventing an occurrence of contact failure caused when the SOG is exposed through the sidewall of the via hole in the via hole formation step in the multilayer wiring steps.

In addition, the selective ratio of the SOG to the under layer $SiO_2$ is about 0.7 to 1.5, and the selective ratio of the SOG to the SiN is as large as possible, for example, 4 or more. By setting the above selective ratios of the SOG to the respective films, even when the SiN undergoes over etching, it is possible to prevent the SiN from being removed. The reason for this is as follows. In the capacitance element portion, especially the periphery portion to which the SOG is applied in a small thickness, the under layer $SiO_2$ is completely removed, but the SiN layer as a protective film remains, so that the upper portion electrode and dielectric of the capacitance element suffer no damage and are not etched.

Subsequently, an $SiO_2$ layer 109 is formed by a plasma CVD process, and via holes 1010, 1011 for taking out electrodes are formed by a photolithography process and a dry etching process, for example.

Then, metal wiring layers 1012, 1013 are formed in the via holes 1010, 1011, respectively. In this instance, an aluminum (Al) alloy is deposited by a sputtering process, or a plug of tungsten (W) is formed by a CVD process and etching back and an Al alloy is deposited by a sputtering process, and then, the resultant film is processed into a predetermined wiring pattern by a photolithography process and a dry etching process.

In the embodiment shown in FIG. 1, the metal wiring layers 1012, 1013 corresponding both the upper portion electrode and the lower portion electrode are formed, but, with respect to a terminal of the lower portion electrode, a wiring can also be formed by the first wiring layer (not shown).

Thus, a capacitance element free from fluctuation in the properties caused by the planarization treatment and having high reliability can be obtained.

Next, as the second embodiment of the present invention, an example of the fabrication process for a semiconductor device using a chemical mechanical polishing (hereinafter, frequently referred to simply as "CMP") process in the planarization step is described below.

Figure 1F:
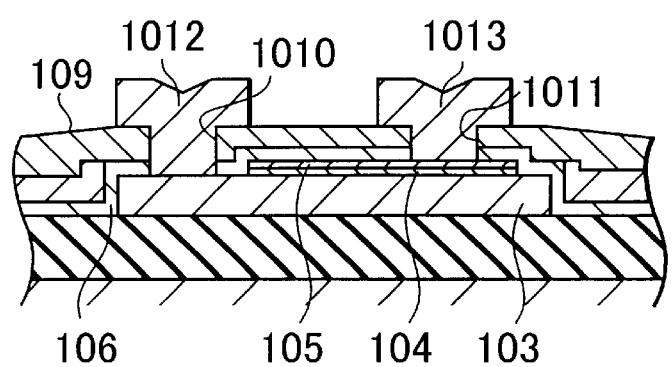
Figure 2D:
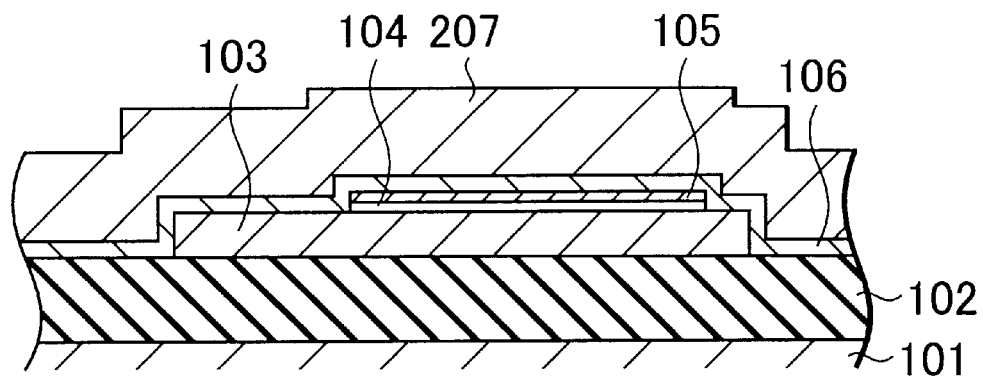
FIGS. 2D to 2F are diagrammatic cross-sectional views illustrating the layer structures in the respective steps of the fabrication process for a semiconductor device according to a second embodiment of the present invention.
Figure 2E:
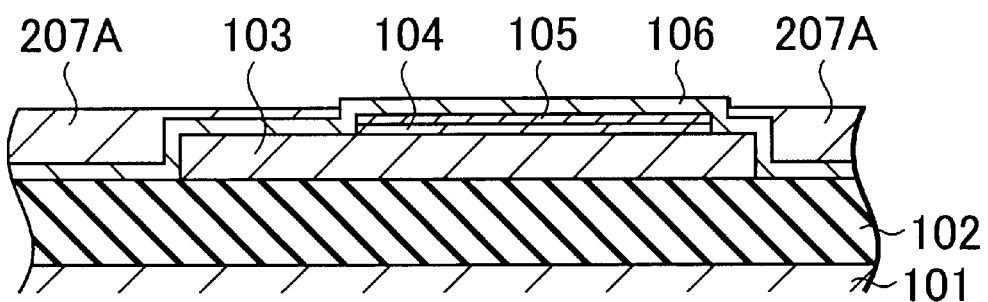
Figure 2F:
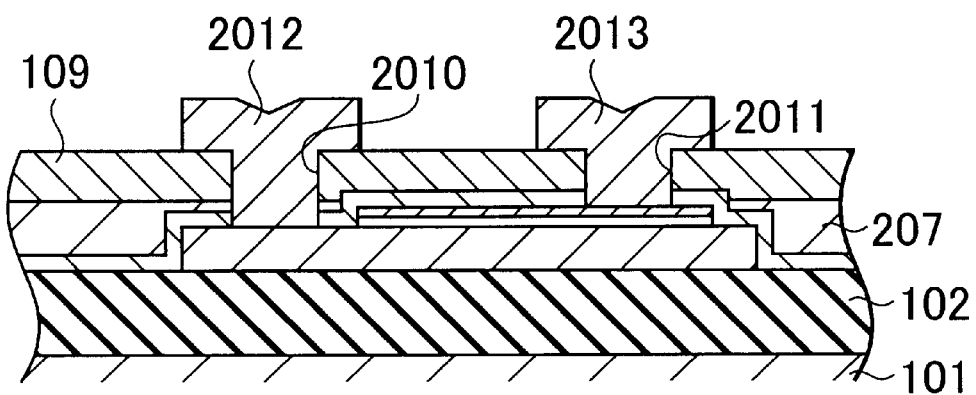

FIGS. 2D to 2F are diagrammatic cross-sectional views showing the fabrication process for a semiconductor device according to the second embodiment of the present invention, and correspond to the steps shown in FIGS. 1D to 1F. In FIG. 1 and FIG. 2, similar parts or portions are indicated by the same reference numerals.

In the present embodiment, in the same manner as in the first embodiment shown in FIGS. 1A to 1C, a capacitance element is formed, and an SiN layer 106 is deposited by a plasma CVD process. Then, as shown in FIG. 2D, an $SiO_2$ layer 207 is deposited by, for example, a high-density plasma CVD process so as to have a thickness of 500 to 2,000 nm.

Then, as shown in FIG. 2E, the SiO$_2$ layer 207 is planarized by a CMP process using the SiN layer 106 as a stopper (so that an SiO$_2$ film 207A remains). In this instance, the SiN layer 106 on the capacitance element serves as a protective film. Therefore, the capacitance element is not exposed, and thus, the upper portion electrode and the dielectric are not etched and suffer no damage.

Subsequently, as shown FIG. 2F, an SiO$_2$ layer 209 is formed by a plasma CVD process, and via holes 2010, 2011 for taking out electrodes are formed by a photolithography process and a dry etching process, for example, and then, metal wiring layers 2012, 2013 are respectively formed therein. These processing processes are the same as those in the first embodiment.

Thus, a capacitance element free from fluctuation in the properties caused by the planarization treatment and having high reliability can be obtained.

In each of the above first and second embodiments, the formulation of the protective film is performed after the patterning of the first wiring layer 103A to be the lower portion electrode 103 for the capacitance element. However, the formation of the protective film is not particularly limited as long as the protective film covers the capacitance element in the planarization step, and, for example, the protective film may be formed before the patterning of the upper portion electrode 105 and etched simultaneously with the patterning of the upper portion electrode 105.

Figure 3:
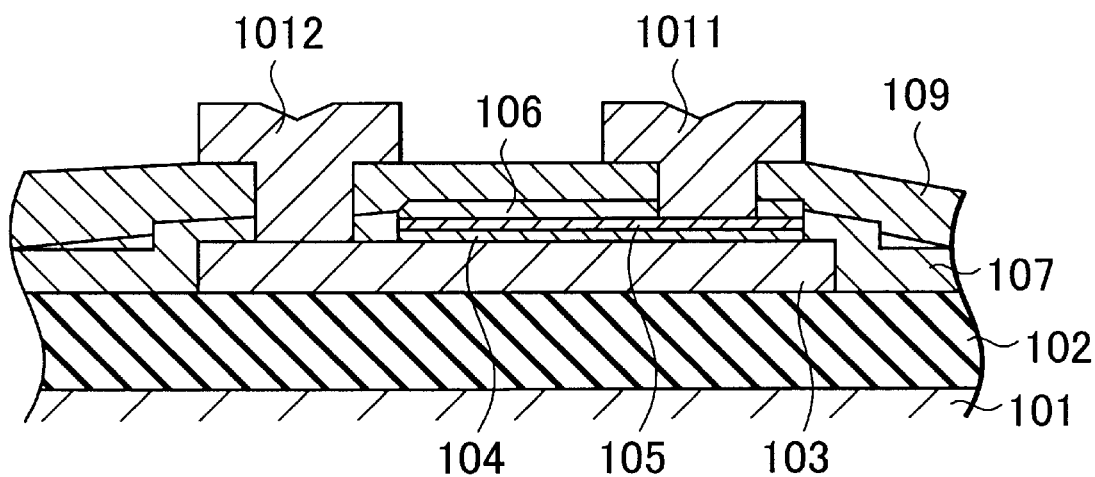
FIG. 3 is a diagrammatic cross-sectional view illustrating the layer structure in the fabrication process for a semiconductor device according to a third embodiment of the present invention.

FIG. 3 is a diagrammatic cross-sectional view illustrating the layer structure in the fabrication process for a semiconductor device in this case.

As shown in FIG. 3, the SiN layer 106 to be a protective film is formed only on an upper surface of the upper portion electrode 105, and the other portion of the SiN layer 106 is removed simultaneously with the etching of the upper portion electrode 105.

In addition, the protective film may be similarly formed before the patterning of the lower portion electrode 103, and etched simultaneously with the patterning of the lower portion electrode 103.

Figure 4:
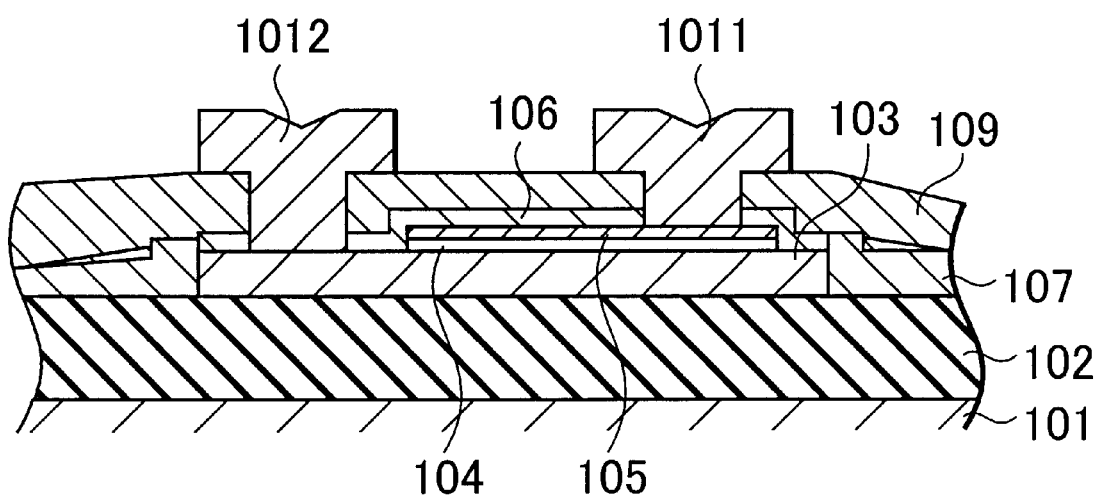
FIG. 4 is a diagrammatic cross-sectional view illustrating the layer structure in the fabrication process for a semiconductor device according to the fourth embodiment of a present invention.
Figure 5:
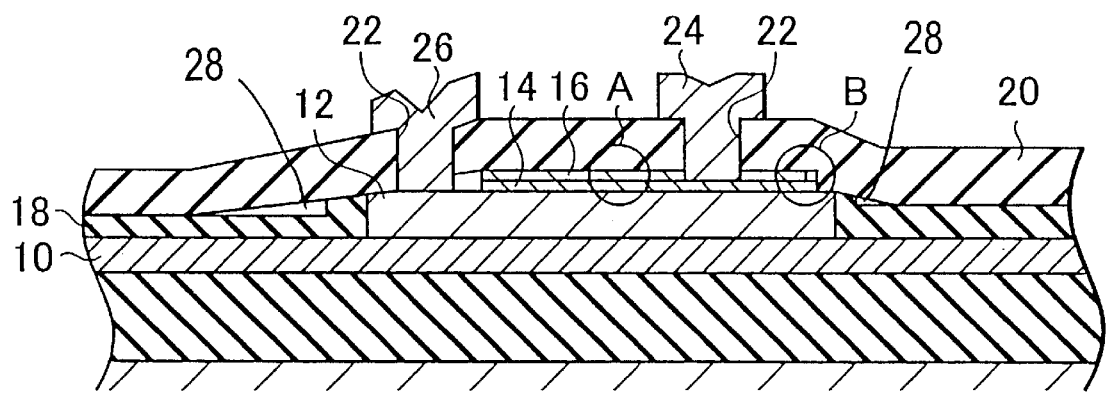
FIG. 5 is a diagrammatic cross-sectional view illustrating the layer structure in the step of a conventional fabrication process for a semiconductor device.

FIG. 4 is a diagrammatic cross-sectional view illustrating the layer structure in the fabrication process for a semiconductor device in this case.

As shown in FIG. 4, the SiN layer 106 to be a protective film is formed only on an upper surface portion over the upper portion electrode 105 to the lower portion electrode 103, and the other portion of the SiN layer 106 is removed simultaneously with the etching of the lower portion electrode 103.

Also by employing the above fabrication processes, a capacitance element free from fluctuation in the properties caused by the planarization treatment and having high reliability can be obtained.

What is claimed is:

1. A process for fabricating a semiconductor device, comprising the steps of:

forming, on an insulator formed on a semiconductor substrate, a first wiring layer to be a lower portion electrode for a capacitance element;

forming, on said first wiring layer, a dielectric film for forming said capacitance element;

forming, on said dielectric film, a second wiring layer to be an upper portion electrode for said capacitance element;

removing said dielectric film and said second wiring layer other than a region in which a capacitance element is to be formed and removing an unnecessary region of said first wiring layer;

depositing an insulator film on a surface of said semiconductor substrate and etching an entire surface of said insulator film so as to planarize the surface of said substrate, wherein:

a protective insulator film which is not removed in the planarization step is formed on at least an upper surface of said capacitance element so that said capacitance element is not exposed in said planarization step, and the protective insulator film is an insulator film containing silicon nitride.

2. A process for fabricating a semiconductor device, comprising the steps of:

forming, a lower electrode of a capacitor on an insulator secured to a semiconductor substrate;

forming a dielectric film for said capacitor on the lower electrode of the capacitor;

forming an upper electrode for said capacitor on said dielectric film;

removing said dielectric film and a conductive layer used in forming the upper electrode other than at a region in which the capacitor is to be formed; and depositing an insulator film over said semiconductor substrate and the electrodes of the capacitor and thereafter etching an entire surface of said insulator film so as to planarize a top surface, wherein:

a protective insulator film which is not removed in the planarization step is formed above at least structures of the capacitor so that said capacitor structures are not exposed in said planarization step, and the protective insulator film is an insulator film containing silicon nitride.

* * * * *